United States Patent
Lu et al.

(10) Patent No.: US 8,518,296 B2
(45) Date of Patent: Aug. 27, 2013

(54) SLURRIES AND METHODS FOR POLISHING PHASE CHANGE MATERIALS

(75) Inventors: Zhenyu Lu, Boise, ID (US); Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 635 days.

(21) Appl. No.: 11/706,755

(22) Filed: Feb. 14, 2007

(65) Prior Publication Data

US 2008/0190035 A1  Aug. 14, 2008

(51) Int. Cl.
*C09K 13/06* (2006.01)

(52) U.S. Cl.
USPC .......... 252/79.4; 252/79.1; 438/691; 438/692

(58) Field of Classification Search
USPC .... 252/79, 79.1; 51/307, 293; 257/E21.214; 451/36; 438/690, 745; 216/88
See application file for complete search history.

(56) References Cited

U.S. PATENT DOCUMENTS

| | | | | |
|---|---|---|---|---|
| 6,821,309 | B2 * | 11/2004 | Singh et al. | 51/307 |
| 2003/0102457 | A1 * | 6/2003 | Miller | 252/79.1 |
| 2003/0164471 | A1 * | 9/2003 | Small et al. | 252/79.1 |
| 2004/0261323 | A1 * | 12/2004 | Minamihaba et al. | 51/309 |
| 2005/0090104 | A1 * | 4/2005 | Yang et al. | 438/689 |
| 2005/0090109 | A1 * | 4/2005 | Carter et al. | 438/692 |
| 2005/0233578 | A1 * | 10/2005 | Jia et al. | 438/633 |
| 2006/0243702 | A1 * | 11/2006 | Minamihaba et al. | 216/88 |
| 2007/0178700 | A1 * | 8/2007 | Dysard et al. | 438/689 |
| 2007/0181850 | A1 * | 8/2007 | Kamimura et al. | 252/79.1 |
| 2007/0290165 | A1 * | 12/2007 | Hou et al. | 252/79.1 |

FOREIGN PATENT DOCUMENTS

CN  1616572  *  5/2005

OTHER PUBLICATIONS

Somasundaran, P; Moudgil, Brij M.; Reagents in Mineral Technology. Marcel Dekker, Inc. New York, 1988, p. 259.*

* cited by examiner

*Primary Examiner* — Lan Vinh
*Assistant Examiner* — Jiong-Ping Lu
(74) *Attorney, Agent, or Firm* — TraskBritt

(57) ABSTRACT

A slurry for polishing a phase change material, such as Ge—Sb—Te, or germanium-antimony-tellurium (GST), includes abrasive particles of sizes that minimize at least one of damage to (e.g., scratching of) a polished surface of phase change material, an amount of force to be applied during polishing, and a static etch rate of the phase change material, while optionally providing selectivity for the phase change material over adjacent dielectric materials. A polishing method includes applying a slurry with one or more of the above-noted properties to a phase change material, as well as bringing the polishing pad into frictional contact with the phase change material. Polishing systems are disclosed that include a plurality of sources of solids (e.g., abrasive particles) and provide for selectivity in the solids that are applied to a substrate or polishing pad.

22 Claims, 5 Drawing Sheets

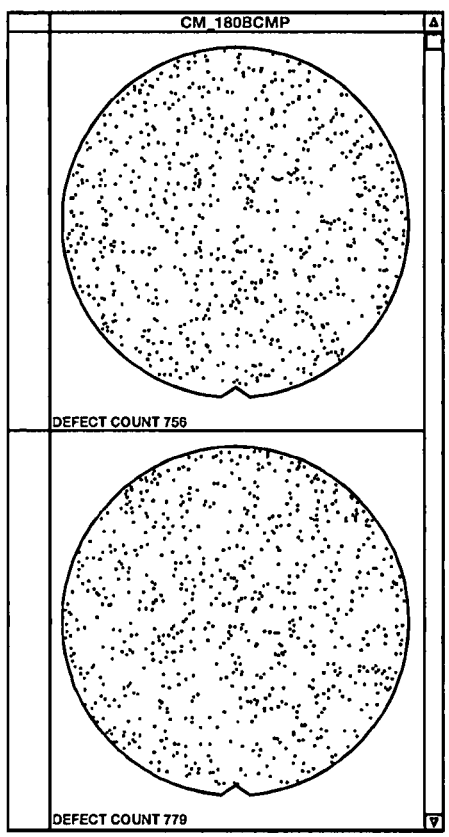 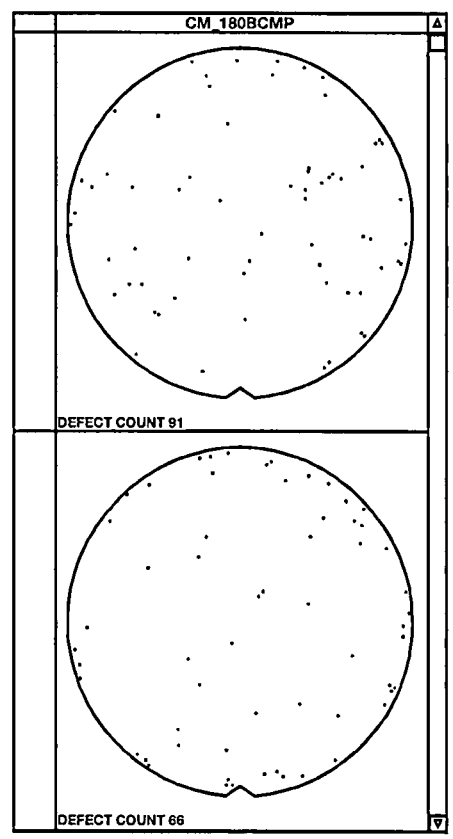
*FIG. 1*  *FIG. 2*

| Location | $R_q$ (nm) | $R_a$ (nm) | Z Range (nm) |
|---|---|---|---|
| Section Center | 1.07 | 0.87 | 8.56 |
| Section Edge | 1.02 | 0.83 | 7.89 |

| Location | Array (nm) | | | Field Arrow (nm) | | |
|---|---|---|---|---|---|---|
| | $R_q$ | $R_a$ | Z Range | $R_q$ | $R_a$ | Z Range |
| "Center" Arrow | 51.78 | 40.23 | 379.46 | 0.63 | 0.50 | 5.47 |
| "Edge" Arrow | 0.70 | 0.56 | 6.20 | 0.89 | 0.72 | 7.47 |

US 8,518,296 B2

SLURRIES AND METHODS FOR POLISHING PHASE CHANGE MATERIALS

FIELD OF INVENTION

The present invention, in various embodiments, relates generally to methods for polishing phase change materials including, without limitation, germanium (Ge)-antimony (Sb)-tellurium (Te) (GST) alloys, and to methods for planarizing phase change materials, as well as to slurries for use in polishing or planarizing films that comprise phase change materials.

BACKGROUND OF INVENTION

Phase change materials, often chalcogenides, are materials with two distinct states—crystalline and amorphous. Due to the distinctly different electrical resistivities of these two states in some chalcogenides, such as GST (which may have relative atomic ratios of about two parts Ge to about two parts Sb to about five parts Te), they are useful in memory devices, such as those known in the art as "phase change random access memory" (PCRAM or PRAM) devices, as well as in DVD-ROM (digital video disc-read-only memory) storage media.

Ever-increasing demands in speed and performance require that device densities increase and feature sizes decrease from one device generation to the next. Accordingly, state-of-the-art PCRAM devices may have very thin (currently about 10 Å or less) phase change components. Some existing processes for depositing phase change materials, including GST, in which the phase change materials are deposited in thin (e.g., about 1,500 Å thick) layers, do not form layers with good conformality, or coverage. As phase change materials are typically deposited onto non-planar surfaces, the surface of the deposited film of phase change material is also non-planar. In fact, slight plug recesses (e.g., about 100 Å deep or less) beneath a film of phase change material may result in even larger non-planarities in the surface of the film. Irregularities, such as recesses, in the surface of a film of phase change material may also appear, and even be amplified, in layers (e.g., a titanium nitride (TiN) film) that are subsequently formed.

These non-planarities may be problematic during subsequent processing (e.g., in patterning masks and the use of such masks to define electrodes, etc.), as well as in operation of a PCRAM device (e.g., diminish reliability, cause cycling issues, etc.). In addition, non-planarities in a film of phase change material may result in poor contact between the phase change material and an overlying layer (e.g., TiN), could cause the phase change material to function in a manner different from that desired (e.g., by altering the desired spatial distribution of the phase change material), such as the ability of the phase change material to cycle between its two conductive states, or the required conditions for effecting such cycling, or otherwise reduce the reliability of a device including the phase change material.

The inventors are not aware of any available processes or compounds that are tailored for polishing or planarizing phase change materials such as GST.

BRIEF DESCRIPTION OF THE DRAWINGS

In the drawings, which depict various embodiments of the present invention,

FIG. 1 is a diagram showing the number of defects of at least 0.18 µm size on borophosphosilicate glass (BPSG) layers on two different silicon wafers when a slurry including 70 nm abrasive particles is used to polish the BPSG;

FIG. 2 is a diagram showing the number of defects of at least 0.18 µm size of BPSG layers on two different silicon wafers when a slurry including 10 nm abrasive particles is used to polish the BPSG;

DETAILED DESCRIPTION

Figure 3:
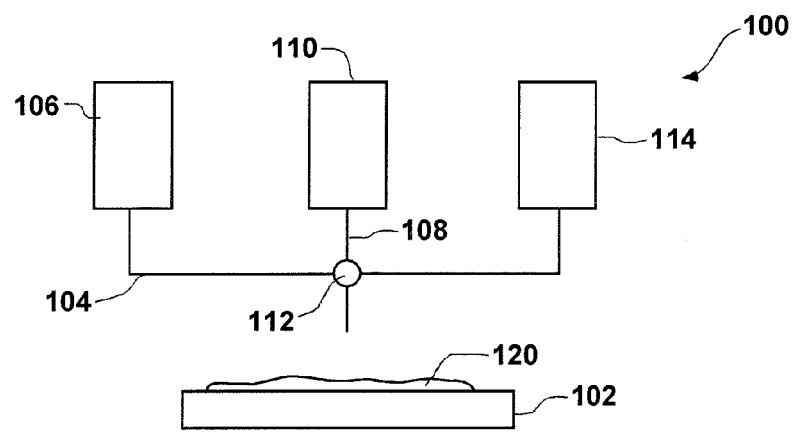
FIG. 3 is a schematic representation of an embodiment of a polishing system that incorporates teachings of the present invention and with which various embodiments of compounds and methods of the present invention may be used or implemented.

The present invention includes embodiments of methods and compounds for polishing or planarizing phase change materials, such as GST, and systems for using such compounds and practicing such methods.

In one embodiment, the present invention includes compounds for polishing or planarizing phase change materials. A non-limiting example of such a compound is a chemical-mechanical polishing slurry for removing a phase change material, such as GST. A slurry according to an embodiment of the present invention may be configured to minimize mechanical damage and removal of oxides or nitrides; for example, by including abrasive particles with relatively small dimensions (e.g., about 7 nm or less to about 20 nm or even up to about 30 nm).

Despite the possible inclusion of such small particles in a slurry of the present invention, it may be configured to polish, or remove, a phase change material, such as GST, at a relatively low force, or "downforce" (e.g., as low as about 3 pounds per square inch (psi) or less, as low as about 1.5 psi or less, etc.). The use of a relatively low polishing downforce may prevent peeling or delamination of the film of phase change material, as well as play a role in minimizing scratching of the film of phase change material or of underlying films or structures that are exposed during the polishing process.

A slurry according to an embodiment of the present invention may also be configured to remove a phase change material, such as GST, at a relatively high rate (e.g., about 200 Å/min. or more, about 400 Å/min. or more, etc., depending, in part, upon the thickness of the polished film, dimensions of the structure of which the film is a part, and the desired degree of uniformity control—desired removal rates may decrease with decreases in feature dimensions). A desired removal rate may be achieved by including an appropriate amount or potency of chemical etchant in the slurry. Any static etching of such a chemical etchant, as well as the effects thereof, such as "dishing," that would otherwise occur by including the chemical etchant in such an amount or at such a potency may be mitigated by including a sufficient amount of an etch inhibitor in the slurry. A static etch rate of the phase change material in such a slurry may be relatively small, or tailored to minimize "dishing," particularly at recessed areas of the film, before and after polishing of the film is effected.

According to another embodiment, the present invention includes methods for polishing or planarizing phase change materials. As an example of such a method, a film of phase change material (e.g., GST) may be polished and, optionally, substantially planarized by applying a slurry of the present invention to the film and using a polishing pad of a known type in conjunction with the slurry to generate sufficient frictional contact to remove material from the film. As the slurry is applied to the film, in embodiments where relatively low local pressures are applied during polishing, appropriately sized (e.g., small) abrasive particles in the slurry will not remove material from surfaces of recesses in an exposed major surface of the film as aggressively as such abrasive particles will remove material from the major surface. Etch inhibitor in the slurry may prevent surfaces of the film within the recesses from being subjected to the same level of exposure to chemical etchants or oxidizers in the slurry as the major surface of the film.

In another embodiment, the present invention also includes systems for polishing. A polishing system may include an additive applicator and an abrasive applicator. One or both of the applicators may communicate with a variety of sources, facilitating selection in the additive and/or abrasive (e.g., abrasive particle concentration, etc.) that are applied to a substrate during polishing.

Other features and advantages of the present invention will become apparent to those of ordinary skill in the art through consideration of the ensuing description, the accompanying drawings, and the appended claims.

As noted, a slurry according to embodiments of the present invention may include, among other things, abrasive particles, a chemical etchant, and an etch inhibitor, as well as an oxidizer, in relative amounts that are tailored to remove thin films of phase change materials, such as GST, with selectivity over dielectric layers (e.g., silicon dioxides, silicon nitrides, silicon oxynitrides, etc.).

A slurry that embodies teachings of the present invention includes a variety of liquid and/or dissolved components. One such component is an oxidizer, as polishing slurries are conventionally formulated to oxidize a material or materials that are to be removed. Without limiting the scope of the present invention, oxidizers that may be included in a slurry of the invention include peroxide, persulfic compounds, iodic compounds, $Fe^{3+}$, and other known, strong oxidizers. When peroxide is included, it may be present in an amount of from about 0.5%, by weight of the slurry, to about five percent (5%) or more of the weight of the slurry (e.g., about 1%, about 2%, etc.). The amount of oxidizer included in the slurry is tailored, of course, to optimize the rate at which material is removed, as too much oxidizer may result in a hard and hard-to-remove surface.

Once the material or materials that are to be removed have been oxidized, they may be more easily removed than in their prior, reduced states by chemical or mechanical means, or a combination of chemical and mechanical means.

A chemical etchant of a slurry according to an embodiment of the present invention dissolves oxidized metal. The chemical etchant may be selected, alone or in conjunction with other components of a slurry, to provide an etch rate that remains substantially uniform during polishing. The chemical etchant may include a group that acts as a good complexing agent. Non-limiting examples of such groups include amino, and carboxyl groups. A specific example of such a chemical etchant is citric ammonium, in which the ammonium is a complexing agent and the citric acid has a buffering effect. Citric ammonium may be included in a slurry of the present invention in an amount of as small as about 0.01% of the weight of the slurry to about five percent (5%) of the weight of the slurry (e.g., about 0.3%, by weight, of the slurry).

Any static etching of such a chemical etchant, as well as the effects thereof, such as "dishing," may be mitigated by including a sufficient amount of an etch inhibitor in the slurry. A static etch rate of a phase change material, such as GST, in such a slurry may be relatively small, or tailored to minimize "dishing" in a film of the phase change material, before and after polishing of the film is effected. An etch inhibitor, such as benzotriazole (BTA), may be applied to decrease the static etch rate of the phase change material.

The amount of etch inhibitor included in a slurry depends, at least partially, upon the desired etch rate. Other factors, such as the amount of oxidizer or chemical etchant included in the slurry, may also be considered in determining a suitable amount of etch inhibitor to be included. As an example, when BTA is employed as the etch inhibitor, it may be included in the slurry in a concentration of about 500 parts per million (ppm), about 1,000 ppm, or any other suitable amount.

Relative amounts of the oxidizer, the chemical etchant, and the etch inhibitor in a slurry of the present invention may enable a static etch rate of as low as about 120 Å/min. or less (e.g., about 70 Å/min or less.) in a slurry according to an embodiment of the present invention. The static etch rate may be decreased by decreasing an amount or potency of oxidizer in such a slurry, increasing an amount or potency of etch inhibitor in such a slurry, or a combination of the foregoing, as shown in the following TABLE 1, which summarizes the static etch rates of GST when exposed to slurries including 0.3% citric ammonium and the listed amounts of peroxide (oxidizer) and BTA (etch inhibitor):

TABLE 1

| BTA | Peroxide | Static Etch Rate (Å/min.) |
| --- | --- | --- |
| 500 ppm | 2% (by weight) | ~120 |
| 500 ppm | 1% (by weight) | ~70 |
| 1,000 ppm | 2% (by weight) | ~80 |

In addition to liquid and dissolved components, a slurry of an embodiment of the present invention includes solids. For example, such a slurry may include abrasive particles. Any known, suitable type of abrasive particles, including, without limitation, colloidal silica, may be included in a slurry according to the present invention. The abrasive particles may comprise any suitable amount of the total slurry; e.g., about one percent (1%) to about five percent (5%) (e.g., about two percent (2%)) of the slurry, by weight.

The abrasive particles may comprise all or substantially all of the solids in such a slurry.

The abrasive particles of a slurry of an embodiment of the present invention may have dimensions that minimize defects, such as mechanical damage (e.g., scratches and other types of damage) to the polished film and adjacent structures. Additionally, the dimensions of the abrasive particles may be selected to increase topography selectivity so that planarization may be improved. The dimensions, or sizes, of such abrasive particles may be about 30 nm across or less (e.g., about 20 nm, about 10 nm, about 7 nm, etc.). Abrasive particles with such small dimensions are available from a variety of manufacturers of CMP slurries, such as Fujimi Corporation of Tualatin, Oregon. When abrasive particles with such small dimensions are included in a slurry that embodies the present invention, even aggregates of the abrasive particles are small enough not to cause a significant amount of mechanical damage, in the form of scratching (e.g., scratches of about 0.18 μm wide or wider) or otherwise, in a polished film of phase change material.

This reduction in defects was verified by analyzing the effects of polishing BPSG layers on silicon wafers with slurries that included 70 nm abrasive particles and comparing the results with the defects present in BPSG layers on silicon wafers that were polished under substantially the same conditions (i.e., within acceptable tolerances), but with a slurry that included 10 nm abrasive particles. Specifically, the number of defects in the BPSG layer of each polished wafer, including scratches and non-visual defects with dimensions of 0.18 μm or greater, were counted by known processes. FIG. 1 shows the results of such analysis on the BPSG layers that were polished by the slurry that included 70 nm abrasive particles, while the number of defects present in BPSG layers polished with a slurry that included smaller, 10 nm abrasive particles are shown in the representation provided in FIG. 2. Specifically, 756 defects and 779 defects were counted in and on the BPSG layers that were polished using 70 nm abrasive particles (FIG. 1), while only 91 and 66 defects were counted in and on the BPSG layers that were polished with slurries that included 10 nm abrasive particles (FIG. 2). These numbers indicate that polishing with a slurry that includes relatively small abrasive particles may decrease scratching by as much as about 80% or more over more conventionally configured slurries, which include larger abrasive particles.

A slurry of an embodiment of the present invention includes an oxidizer, a chemical etchant, an etch inhibitor, and abrasive particles, and, optionally, other components in amounts that are tailored to impart such a slurry with the ability to polish, or remove, a phase change material, such as GST, at a relatively low downforce (e.g., about 3 psi or less, about 1.5 psi or less, about 0.3 psi, etc.) but at a relatively high rate (e.g., about 200 Å/min. or more, about 400 Å/min. or more, etc.). Such a slurry may also be formulated to remove a phase change material with selectivity over other materials, such as dielectric materials (e.g., silicon dioxides, silicon nitrides, silicon oxynitrides, etc.) that underlie portions of the film of phase change material and that are to be located adjacent to a resulting phase change component. As a specific, non-limiting example, an embodiment of a slurry of the present invention may include one percent (1%) peroxide, 0.3% citric ammonia, 500 ppm BTA, and two percent (2%) colloidal silica, with all percentages being calculated on the basis of the total weight of the slurry.

Turning now to FIG. 3, a polishing system 100 with which a slurry (e.g., as a slurry of the present invention, etc.) may be used is schematically illustrated. Polishing system 100 includes a polishing pad 102, an additive applicator 104, an abrasive applicator 108, and a rinse system 114, each of which may comprise components of types known in the art.

Additive applicator 104 and abrasives applicator 108 are configured to apply parts of a slurry 120 to polishing pad 102 or to a substrate (not shown) with which polishing pad 102 is to be used. As illustrated, additive applicator 104 communicates with a source 106 of additives (e.g., a polishing solution, oxidizers, etchants, etc.). Abrasive applicator 108 similarly communicates with sources 110 of abrasive. A mixer 112 may be applied to ensure adequate mixing (e.g., which includes abrasive particle dispersion). Such a configuration provides for tunable selectivity in and during the polishing process (e.g., by way of a valve, which may be controlled by computer, manually, etc.). In an example of the use of such a system, an initial fast removal may be followed by a soft landing. As another example, if removal of some dielectric material is also desired when a selective slurry (e.g., for phase change material over dielectric material) according to the present invention is employed a concentration of particles in a polishing slurry may be increased during a polishing process.

Rinse system 114 is configured to dilute a slurry on polishing pad 102, a substrate, or both, or to remove the slurry from polishing pad 102, substrate, or both.

With reference to FIGS. 4 through 13, an example of a process that incorporates teachings of the present invention is illustrated.

Figure 4:
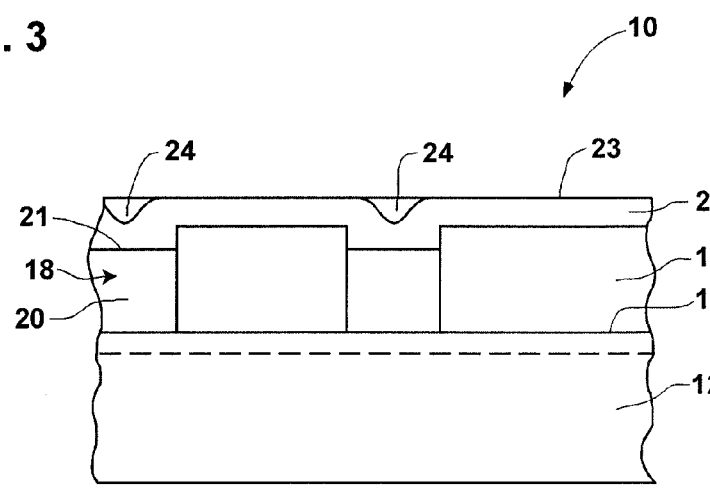
FIG. 4 is a cross-sectional representation of a semiconductor device structure with a layer of phase change material that is to be polished in accordance with embodiments of the present invention.

In FIG. 4, a portion of a semiconductor device structure 10 is depicted. Semiconductor device structure 10 includes, among other things, a substrate 12 with an active surface 14, a dielectric layer 16 formed over active surface 14 and including a contact aperture 18 therethrough, and a conductive plug 20 (e.g., a titanium nitride plug) filling a portion of contact aperture 18. Thus, a surface 21 of conductive plug 20 is recessed relative to a corresponding surface of the dielectric layer 16. Semiconductor device structure 10 may be formed by known processes for fabricating PCRAM devices.

A phase change layer 22, which includes phase change material (e.g., GST), is formed over dielectric layer 16. Any suitable process, including, without limitation, known physical vapor deposition (PVD), metalorganic chemical vapor deposition (MOCVD) processes, or the like, may be used to form phase change layer 22. Phase change layer 22 may be deposited at a thickness that exceeds a desired final thickness of phase change layer 22. By way of non-limiting example, if a final thickness of about 500 Å to about 1,500 Å is desired, the thickness to which phase change layer 22 is formed may be about 750 Å to about 1,750 Å, respectively. In a more specific example, shown in FIG. 5, phase change layer 22 may have an initial thickness of about 1,160 Å, with a desired final thickness of about 500 Å (e.g., 510 Å; see FIG. 9).

Figure 6:
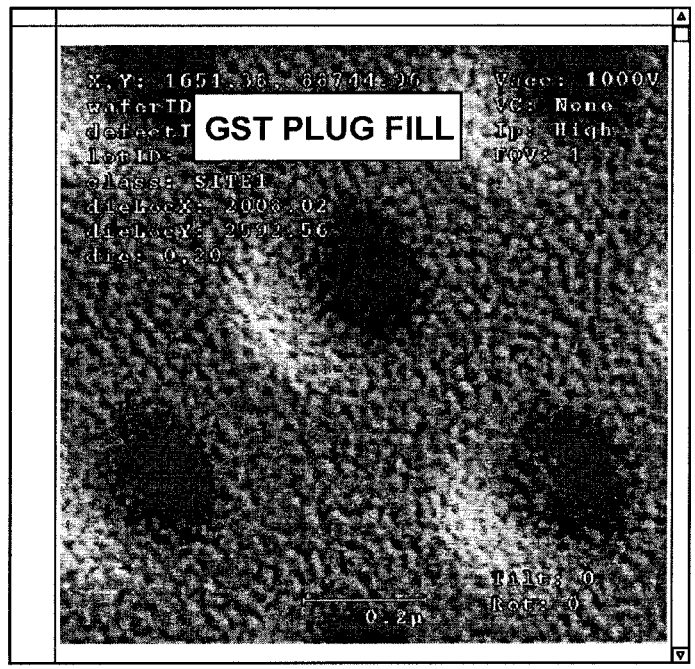
FIG. 6 is scanning electron micrograph depicting a surface of a semiconductor device structure of the type shown in FIGS. 4 and 5.

As phase change layer 22 is formed, phase change material thereof fills a remainder of contact aperture 18. As a result, recesses 24 are formed in a surface 23 of phase change layer 22. Recesses 24 are located over corresponding indentations, such as contact apertures 18, as illustrated in FIG. 4. FIG. 6 provides another view of surface 23, which is a scanning electron micrograph (SEM) that shows the topography of surface 23 of phase change layer 22, including a plurality of recesses 24 formed therein.

Figure 7:
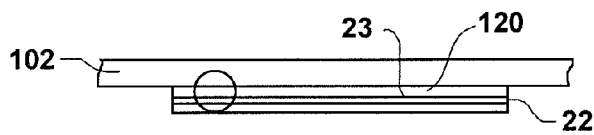
FIG. 7 illustrates polishing of a layer of phase change material.
Figure 8:
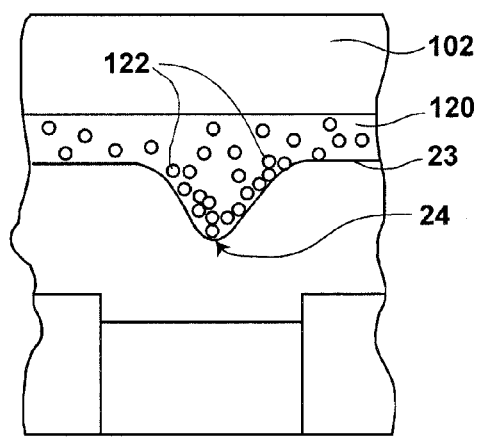
FIG. 8 is an enlarged view of the region depicted in the circle of FIG. 7.

Recesses 24 and other non-planarities in surface 23 of phase change material may be removed by polishing phase change layer 22. As shown in FIG. 7, a slurry 120, such as a slurry that incorporates teachings of the present invention, as described hereinabove, may be applied to surface 23 of phase change layer 22. As shown in the close-up view provided by FIG. 8, some particles 122 of slurry 120 are introduced into recesses 24 and may not polish aggressively (e.g., due to the presence of less localized pressure within recesses 24 in surface 23 than that present on surface 23 during polishing, etc.).

With returned reference to FIG. 7, a polishing pad 102 may be placed over slurry 120 and brought into frictional contact with surface 23 (e.g., by rotation, vibration, or otherwise, of one or both of semiconductor device structure 10 (FIG. 4) and polishing pad 102, as known in the art). The force, or downforce, at which such frictional contact is applied between polishing pad 102 and surface 23 may be relatively low (e.g., about 3 psi or less, about 1.5 psi or less, about 0.3 psi, etc.). The applied downforce may be substantially constant throughout the process, or greater downforce (e.g., 7 psi when layer 22 is to be substantially removed by the polishing processes, leaving only phase change plugs, 3 psi when a reduction in layer thickness or substantial planarization is desired, etc.) may be initially applied, then reduced (e.g., to 2 psi, 1.5 psi, 1 psi, or less), gradually or incrementally, prior to completion of the polishing process. As such frictional contact occurs, material of phase change layer 22 is removed.

As an alternative approach to the use of different amounts of downforce at different points in a polishing process, abrasive particles with different concentrations may be used to polish a substrate at different times during a polishing process, such as with a system of the type described with reference to FIG. 3. Higher concentrations of abrasive particles may be used before relatively lower concentrations of abrasive particles to improve material removal rates.

Material removal may be effected until a polished surface of layer 22 is substantially planar (e.g., includes small recesses than were present before polishing), until a thickness of layer 22 is substantially a desired final thickness thereof, or until a surface of dielectric layer 16 is exposed, such as in cases where the formation of a phase change plug is desired.

When a slurry including 1% peroxide, 0.3% citric ammonia, 500 ppm BTA, and 2% colloidal silica, all percentages by weight, was used to polish a GST film at downforces of 1.5 psi and 2.0 psi, the rates at which GST was removed were:

TABLE 2

| Process | Edge Removal (Å/min.) | Middle removal (Å/min.) | Center removal (Å/min.) | Avg. removal (Å/min.) |
|---|---|---|---|---|
| 1.5 psi 80/70 rpm | 138 | 461.4 | 512.3 | ~370 |
| 2.0 psi 80/70 rpm | 246.3 | 564 | 522.2 | ~444 |

Further optimization of the slurry provided the following results, in which edge removal rates were even further increased:

TABLE 3

| Process | Edge Removal (Å/min.) | Middle removal (Å/min.) | Center removal (Å/min.) | Avg. removal (Å/min.) |
|---|---|---|---|---|
| 1.5 psi 80/70 rpm 0.5% $H_2O_2$ | 230 | 230 | 408 | 289 |
| 2.0 psi 80/70 rpm 1% $H_2O_2$ | 513 | 560 | 572 | 548 |

To demonstrate the selectivity with which the same slurry formulation removes GST over silicon nitride, further polish testing was performed, as set forth in the following table:

TABLE 4

| Process | Silicon Nitride Polish Rate (Å/min.) |
|---|---|
| 1.0 psi 80/70 rpm | ~11 |
| 1.5 psi 80/70 rpm | ~16 |
| 2.0 psi 80/70 rpm | ~18 |

Figure 5:
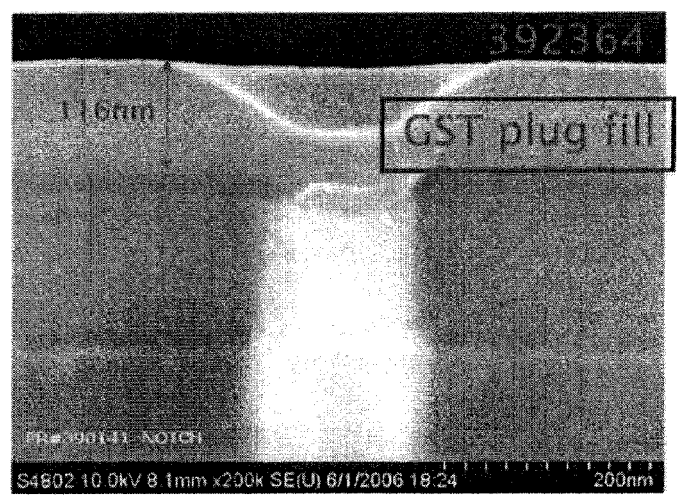
FIG. 5 is a scanning electron micrograph of a section of a semiconductor device structure with a layer of phase change material that is to be polished.
Figure 9:
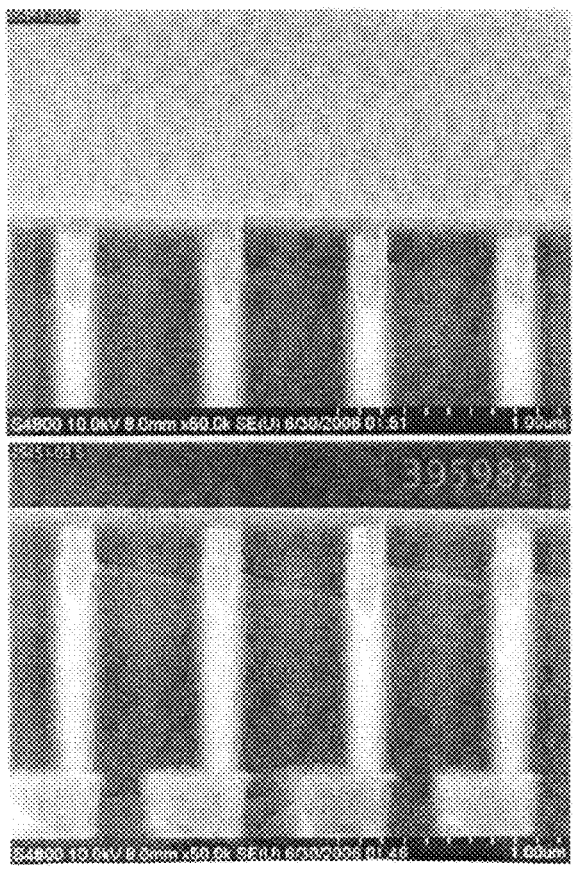
FIG. 9 is a scanning electron micrograph of a section of a semiconductor device structure with a layer of phase change material that has been polished.
Figure 10:
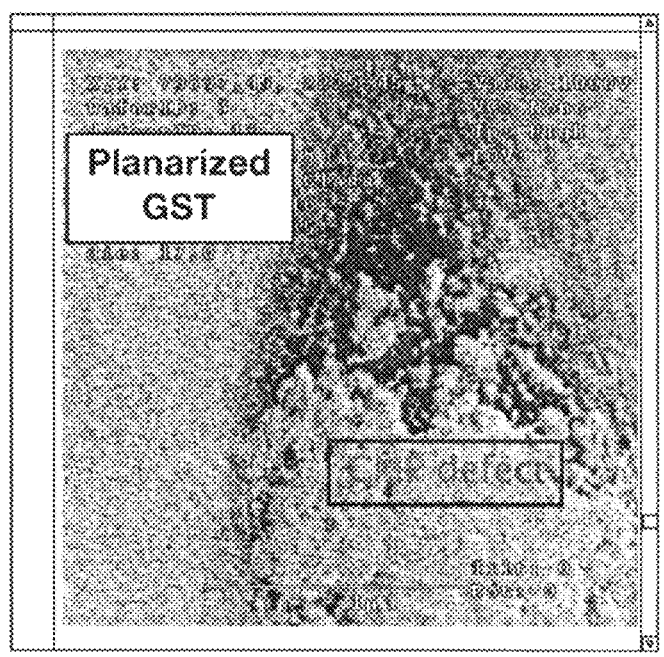
FIG. 10 is scanning electron micrograph depicting a surface of the polished layer of phase change of a semiconductor device structure of the type shown in FIG. 9.

During polishing, the dimensions, or sizes, of recesses 24 are reduced, or recesses 24 are substantially eliminated from phase change layer 22 as the thickness of phase change layer 22 is reduced to about its desired final thickness, as shown in FIGS. 9 and 10, which correspond to FIGS. 5 and 6, respectively.

Figure 11:
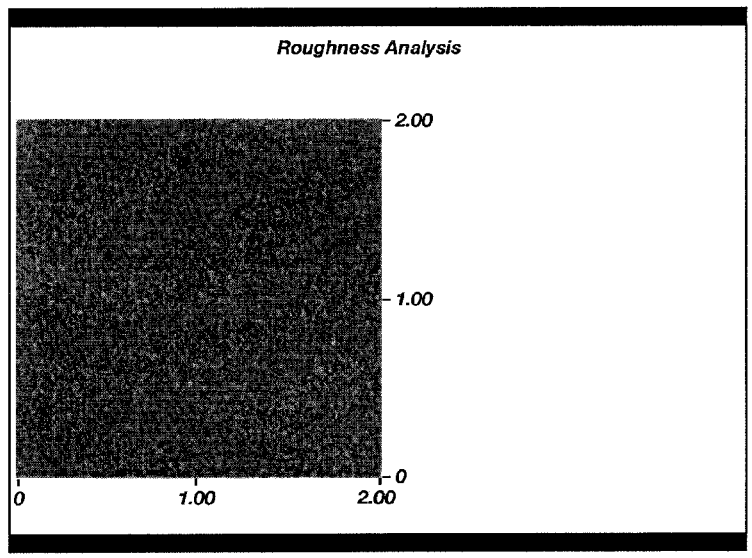
FIGS. 11 and 12 are atomic force microscope (AFM) images of a layer of phase change material before and after polishing, respectively.

In addition to reducing the dimensions, or sizes, of recesses 24, when a slurry of the present invention is used in such a polishing process, a surface roughness of phase change layer 22 may be reduced. In this regard, FIGS. 11 and 12, respectively show atomic force microscope (AFM) images of an as-deposited surface of a phase change layer (a GST film) and a post-polishing surface of the same phase change layer. As shown in FIG. 11, an AFM analysis of a surface of an MOCVD-deposited phase change layer 22 prior to polishing provides the following information:

TABLE 4

| Location | $R_q$ (nm) | $R_a$ (nm) | Z Range (nm) |
|---|---|---|---|
| Center | 1.07 | 0.87 | 8.56 |
| Edge | 1.02 | 0.83 | 7.89 | where $R_a$ is an average roughness, measured in terms of an absolute value of the heights of surface roughness features within a region from which measurements are obtained; $R_q$ is the root mean square (RMS) roughness, which is a measure of the magnitude of variations in the heights of a surface roughness features within an analyzed region; and Z Range is the total extent of height variation, or the maximum surface feature roughness height, in the analyzed region of a surface.

Figure 12:
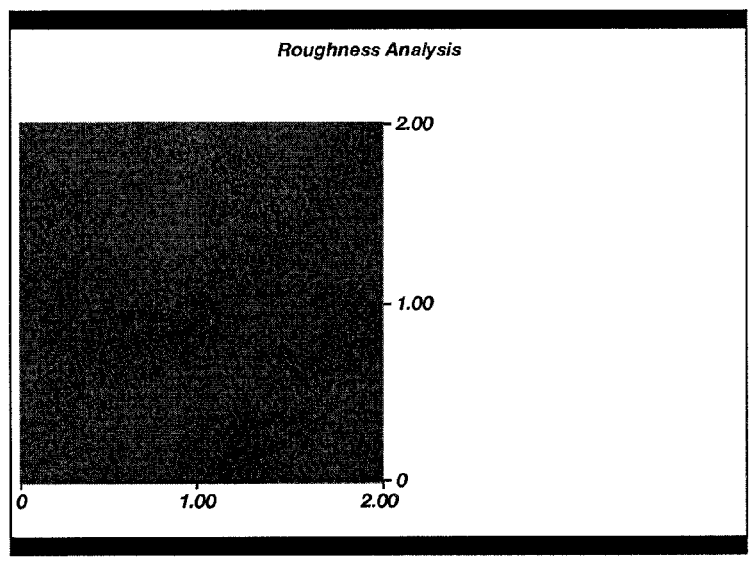

An AFM analysis of phase change layer 22 after polishing has occurred, which is illustrated in the image shown in FIG. 12, provides the following data:

TABLE 5

| Location | $R_q$ (nm) | $R_a$ (nm) | Z Range (nm) |
|---|---|---|---|
| Center | 0.63 | 0.50 | 5.47 |
| Edge | 0.89 | 0.72 | 7.47 |

A comparison of the data in TABLE 4 with the data in TABLE 5 indicates that polishing with a slurry according to the present invention reduces surface roughness of a layer or film of a phase change material, such as GST.

Once polishing is complete, any remaining slurry and debris may be removed from semiconductor device structure 10, such as by known clean and rinse processes. Subsequent processing (e.g., the deposition of a titanium nitride layer, etc.) may then be effected, as known in the art. When the polishing process is used to increase the planarity of layer 22, subsequently formed layers (e.g., material layers, mask layers, etc.) may also have optimal planarity.

While polishing has been described and illustrated in the context of polishing layers of phase change materials on semiconductor device structures, embodiments of the present invention may also be employed to polish or planarize layers of phase change materials in other contexts (e.g., on other substrates) as well.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein that fall within the meaning and scope of the claims are to be embraced thereby.

What is claimed:

1. A slurry for use in polishing a germanium-antimony-tellurium (GST) material, the slurry consisting essentially of: from about 1% by weight to about 2% by weight of a peroxide; from about 0.01% by weight to about 5% by weight of citric ammonium; from about 500 ppm to about 1000 ppm of benzotriazole; and from about 1% by weight to about 2% by weight colloidal silica abrasive particles, each of the
   colloidal silica abrasive particles having a particle size of about 30 nm or less; wherein the slurry exhibits selectivity for a germanium-antimony-tellurium material over a
   dielectric material.

2. The slurry of claim 1, wherein the slurry is formulated to remove the germanium-antimony-tellurium material during polishing processes with a downforce of at most about 3 psi and at a rate of at least about 200 Å/min.

3. The slurry of claim 2, wherein the slurry is formulated to remove the germanium-antimony-tellurium material during polishing processes with a downforce of at most about 1.5 psi.

4. The slurry of claim 2, wherein the slurry is formulated to remove the germanium-antimony-tellurium material at a rate of at least about 400 Å/min.

5. The slurry of claim 1, having a static etch rate of a germanium-antimony-tellurium material of no more than about 120 Å/min.

6. The slurry of claim 5, having a static etch rate of the germanium-antimony-tellurium material of no more than about 70 Å/min.

7. The slurry of claim 1, wherein the peroxide comprises about 1% by weight of the slurry.

8. The slurry of claim 7, wherein the peroxide comprises about 2% by weight of the slurry.

9. The slurry of claim 1, wherein the citric ammonium comprises about 0.3% by weight of the slurry.

10. The slurry of claim 1, wherein the benzotriazole is present in an amount of about 500 ppm in the slurry.

11. The slurry of claim 1, wherein the colloidal silica abrasive particles each have a particle size of about 20 nm or less.

12. The slurry of claim 1, wherein the colloidal silica abrasive particles each have a particle size of about 10 nm.

13. A method for polishing a germanium-antimony-tellurium (GST) material, comprising:
   applying a slurry to the germanium-antimony-tellurium material, the slurry consisting essentially of:
     from about 1% by weight to about 2% by weight of a peroxide;
     from about 0.01% by weight to about 0.05% by weight of citric ammonium; and
     from about 500 ppm to about 1000 ppm of benzotriazole; and
     from about 1% by weight to about 2% by weight colloidal silica particles, each of the colloidal silica particles having a particle size of about 30 nm or less; and
   bringing a polishing pad into frictional contact with the germanium-antimony-tellurium material to polish the germanium-antimony-tellurium material with selectivity for the germanium-antimony-tellurium material over an adjacent dielectric material.

14. The method of claim 13, wherein bringing the polishing pad into frictional contact with the germanium-antimony-tellurium material comprises bringing the polishing pad into frictional contact as the slurry is in place between the phase change material and the polishing pad.

15. The method of claim 13, wherein bringing the polishing pad into frictional contact with the germanium-antimony-tellurium material comprises removing the germanium-antimony-tellurium material at a rate of at least about 200 Å/min.

16. The method of claim 13, wherein bringing the polishing pad into frictional contact with the germanium-antimony-tellurium material comprises removing the germanium-antimony-tellurium material at a rate of at least about 400 Å/min.

17. The method of claim 13, wherein, after applying the slurry to the germanium-antimony-tellurium material and before bringing the polishing pad into frictional contact with the germanium-antimony-tellurium material, the slurry removes the germanium-antimony-tellurium material at a rate of no more than about 120 Å/min.

18. The method of claim 13, wherein, after applying the slurry to the germanium-antimony-tellurium material and before bringing the polishing pad into frictional contact with the germanium-antimony-tellurium material, the slurry removes the germanium-antimony-tellurium material at a rate of no more than about 70 Å/min.

19. The method of claim 13, wherein bringing the polishing pad into frictional contact with the germanium-antimony-tellurium material comprises applying a downforce of at most about 3 psi to the polishing pad or to a substrate that carries the germanium-antimony-tellurium material.

20. The method of claim 13, wherein bringing the polishing pad into frictional contact with the germanium-antimony-tellurium material comprises applying a downforce of at most about 1.5 psi to the polishing pad or to a substrate that carries the germanium-antimony-tellurium material.

21. The method of claim 13, wherein bringing the polishing pad into frictional contact with the germanium-antimony-tellurium material increases a planarity of a surface of the germanium-antimony-tellurium material.

22. The method of claim 13, wherein:
   applying a slurry to the germanium-antimony-tellurium material comprises concurrently applying the slurry to the germanium-antimony-tellurium material and the adjacent dielectric material; and
   bringing a polishing pad into frictional contact with the germanium-antimony-tellurium material comprises removing the germanium-antimony-tellurium material without removing the adjacent dielectric material.

* * * * *